(12) United States Patent
Lin (10) Patent No.: US 6,677,668 B1
(45) Date of Patent: Jan. 13, 2004

(54) CONFIGURATION FOR TESTING A SUBSTRATE MOUNTED WITH A MOST PERFORMANCE-DEMANDING INTEGRATED CIRCUIT

(76) Inventor: Paul T. Lin, 673 Hillchrest Ter., Fremont, CA (US) 94539

( * ) Notice: Subject to any disclaimer, the term of this patent is extended or adjusted under 35 U.S.C. 154(b) by 106 days.

(21) Appl. No.: 09/727,913

(22) Filed: Nov. 28, 2000

Related U.S. Application Data (63) Continuation-in-part of application No. 09/229,139, filed on Jan. 12, 1999.
(60) Provisional application No. 60/071,177, filed on Jan. 13, 1998.

(51) Int. Cl.[7] .......................... H01L 23/48; H01L 23/52; H01L 9/40
(52) U.S. Cl. .................. 257/685; 257/684; 257/723; 257/777; 257/724; 257/778; 257/738; 428/209
(58) Field of Search ................. 257/778, 777, 257/723, 724, 686, 685, 774, 738; 428/209

(56) References Cited

U.S. PATENT DOCUMENTS

| | | | | |
|---|---|---|---|---|
| 5,754,410 A | * | 5/1998 | Bardsley et al. | 361/777 |
| 5,757,074 A | * | 5/1998 | Matloubian et al. | 257/702 |
| 6,064,219 A | * | 5/2000 | Aigner | 324/763 |
| 6,246,252 B1 | * | 6/2001 | Malladi et al. | 257/700 |
| 6,278,286 B1 | * | 8/2001 | Farnworth et al. | 324/755 |
| 2002/0195704 A1 | * | 12/2002 | Chan et al. | 257/778 |

* cited by examiner

*Primary Examiner*—Alexander O. Williams
(74) *Attorney, Agent, or Firm*—Bo-In Lin (57) ABSTRACT

The present invention discloses a method for mounting multiple integrated circuit (IC) chips on a top surface of a substrate. The method includes a step forming a first footprint to include a plurality of electrical contacts on the top surface for mounting a first IC chip thereon. The method further includes a step of forming a set of substrate testing footprints to include a plurality of package mounting and testing electrical contacts for temporarily mounting a plurality of testing packages to conduct a functional MCM test. The functional MCM test is to test the substrate mounted with the first IC chip and the testing packages.

10 Claims, 7 Drawing Sheets

Design of
Known Good Substrate
Few Chips BGA

Fig. 4A

Substrate Design of
Present State of the Art
Few Chips BGA

Fig. 1A

Top View

CONFIGURATION FOR TESTING A SUBSTRATE MOUNTED WITH A MOST PERFORMANCE-DEMANDING INTEGRATED CIRCUIT

This Application is a Continuation-in-part Application and claims a priority date of Jan. 13, 1998 of a Provisional Patent Application No. 60/071,177 that was filed as a Formal application Ser. No. 09/229,139 on Jan. 12, 1999.

BACKGROUND OF THE INVENTION

1. Field of the Invention

This invention relates generally to the electronic package. More particularly, this invention relates to a new and improved manufacture process by first selecting a known good substrate (KGS) by first testing a substrate mounted with a most performance-demanding chip before testing and mounting additional multiple chips onto the substrate.

2. Description of the Prior Art

There is a challenge faced by those applying the multiple-chip module (MCM) technology to package multiple electronic chips into a single module employing a substrate formed with interconnecting traces with the traces checked only with visual inspections or a simplified open-short test. This challenge arises from the fact that the substrate now formed with interconnected traces when mounted on with multiple chips may not function appropriately to satisfy the requirements of high frequency high speed performance, particularly the substrate is not functionally tested. The issues are not obvious for conventional MCM when the packing density and performance level are not as stringent as newer MCM designs where low K dielectric coefficients are required with copper metallization for packaging integrated circuit (IC) chips with feature sizes of 0.1 micron or smaller. The total system performance with higher packing density to achieve higher operational speed will eventually limited by signal integrity transmitted over the interconnecting traces rather than the integrated circuit (IC) chips.

Figure 1A:
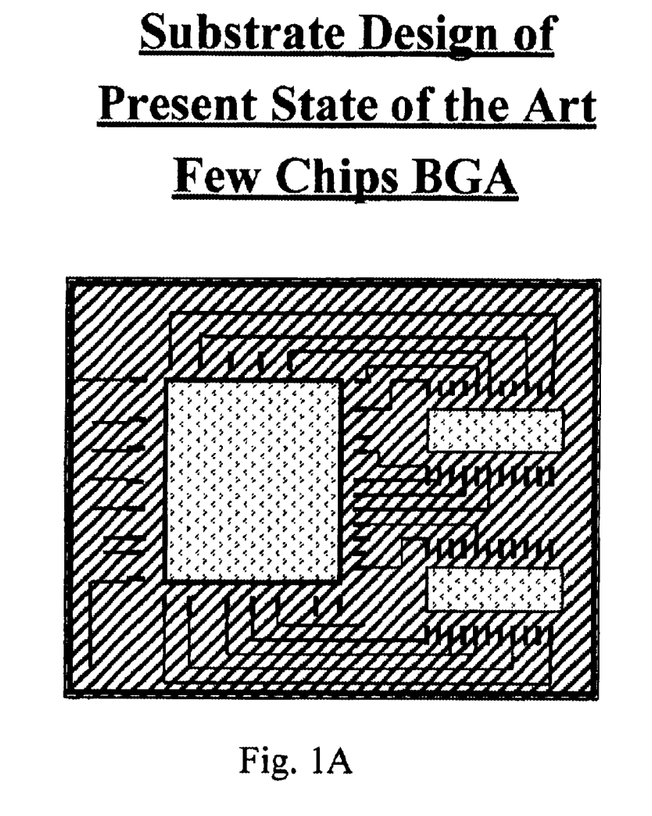
FIGS. 1A to 1D show a top view of a substrate, a top view, a cross sectional view and bottom view respectively of a MCM assembly manufactured with a conventional method.
Figure 1B:
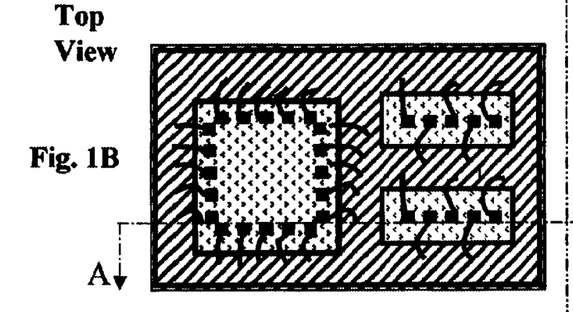
Figures 1C, 1D:
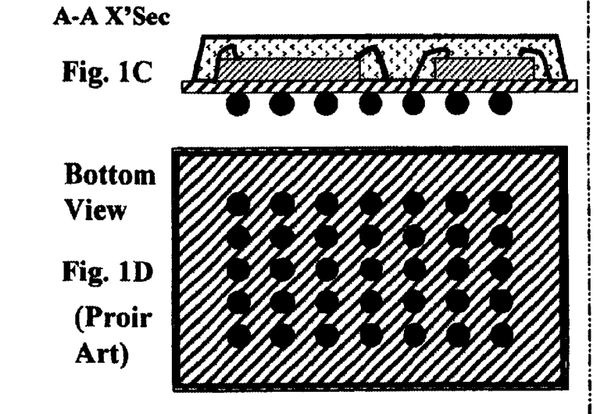
Figure 1E:
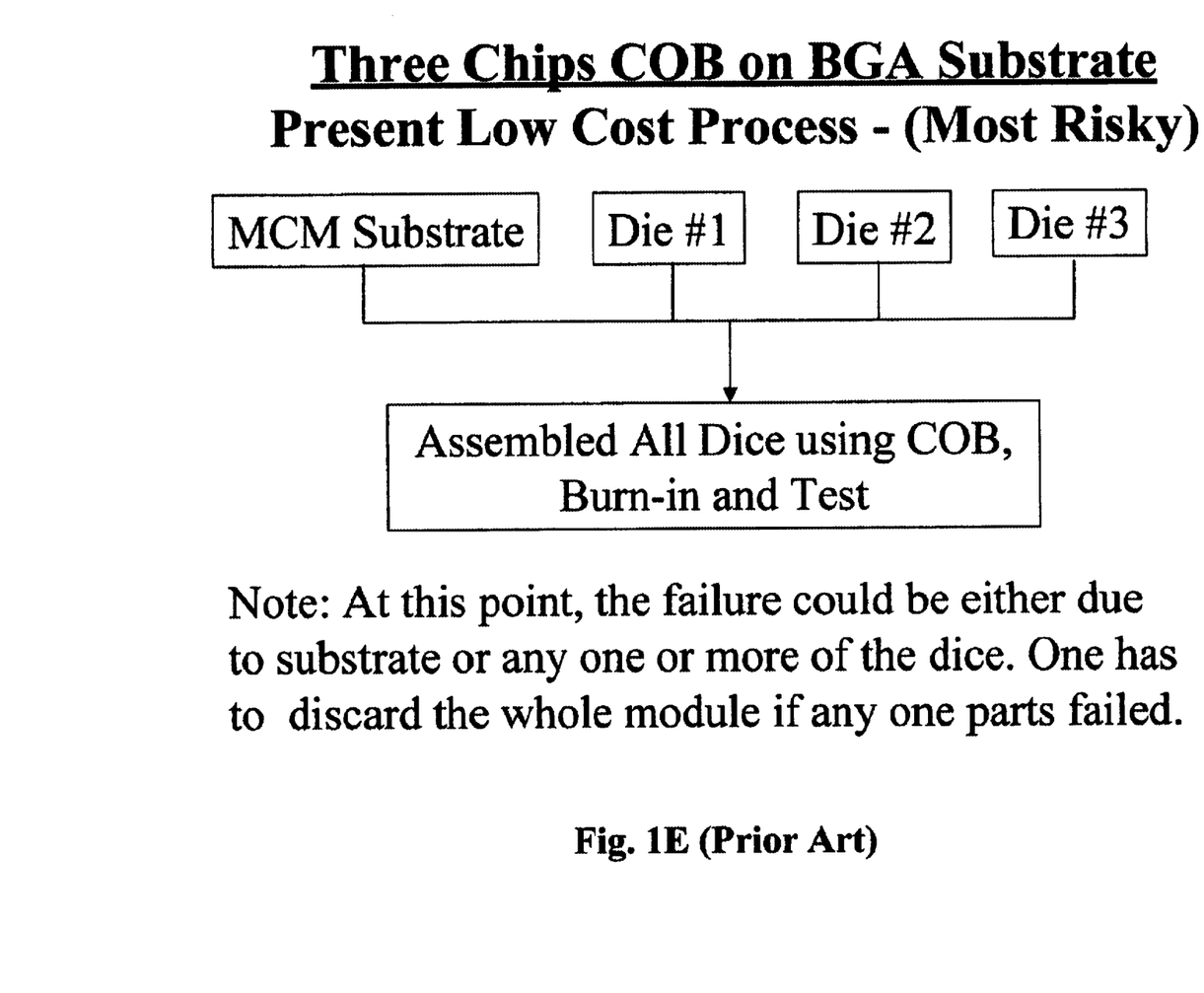
FIGS. 1E and 1F are two flowcharts for illustrating the process flow implemented in two alternate conventional processes for manufacturing a MCM assembly.

Conventional method of manufacturing a MCM assembly without first electrically testing the substrate together with at least one IC chip, often causes significant reduction in production yield due to the performance mismatches between the substrate and the chips mounted onto the substrate. Failures of the substrate or any one of the multiple chips can also affect production yield. Referring to FIGS. 1A to 1D for a top view of a substrate and a top view, side cross sectional view and bottom view respectively of a conventional MCM assembly that includes three IC chips. FIG. 1E is a flow chart for illustrating the process flow for manufacturing the MCM assembly shown in FIGS. 1A to 1C. The MCM substrate supports the interconnecting traces and the ball grid array as that shown in FIG. 1C is manufactured. The first, second, and third IC chips are mounted onto the substrate, with a top view shown in FIG. 1B, using a chip on board (COB) process. As that shown in FIGS. 1B and 1C, standard wire bonding processes are carried out for packaging direct-attached multiple chips and the substrate. As shown in FIG. 1B, an encapsulation is applied to cover multiple chips and to protect the bonding wires under the encapsulation. Then a burn-in and functional tests are performed to determine whether the MCM assembly would pass or fail the tests. At this point, failure of the substrate or anyone of the multiple chips can lead to the failure of the MCM assembly. Employment of a substrate without actual functional test as now commonly implemented in the manufacturing process of the MCM assemblies can therefore cause significant reduction of production yield, particularly when there are more stringent requirements now imposed on the performance of the substrate as well as on the chips.

Figure 1F:
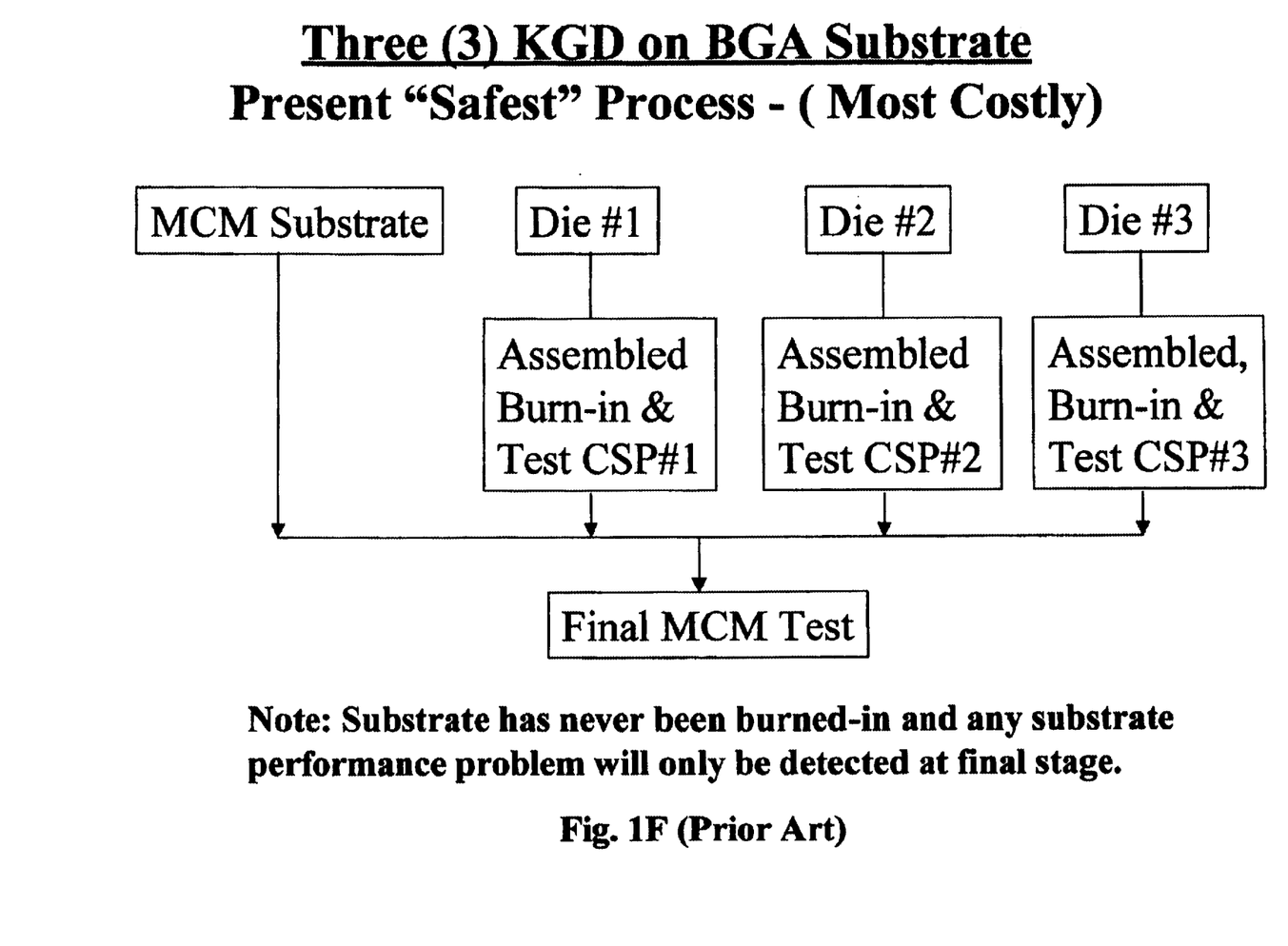

For the purpose of increasing the production yield, FIG. 1F is a flow chart of showing another process flow by first assembling, burning testing each of the multiple chips as chip size package (CSP). These tested and known-good CSP chips are then mounted on a substrate provided with BGA or a land-grid array. This process is most costly and production can be improved by assuring only known good dies are employed. This method however can still be impacted by using a substrate due to the fact that the substrate is untested and probably cannot achieve the performance requirements with higher speed and packaging density are now required for the MCM assembly.

Therefore, a need still exits in the art to provide an improved configuration and procedure for testing and packaging the multiple chip modules to minimize the adverse impact on production yield due to inadequate performance of the substrate after multiple chips mounted are mounted. More specifically, an improved process and configuration to assure a substrate can properly function with a most performance demanding chip must be first tested to resolve the difficulties of low production yield as now encountered by the conventional methods of MCM manufacture.

SUMMARY OF THE PRESENT INVENTION

It is therefore an object of the present invention to provide an improved configuration and procedure for testing and packaging the multiple chip modules (MCMs). The improved MCM package configuration provide a process flow to fully test the substrate with the most performance-demanding chip mounted and known good tested packages to assure the substrate can function properly. The process flow and configuration ensure production yield is improved without unduly increasing the production costs. The difficulties and limitations as that encountered in the prior art are resolved.

Specifically, it is an object of the present invention to provide an improved MCM configuration and procedure for testing and packaging multiple chips as MCM assemblies by employing a specially configured substrate. The substrate is provided for first mounting a most performance-demanding chip and then using a set of footprints formed on the substrate for clamping remainder of multiple chips for carrying out a functional MCM test to assure the substrate is working properly. The functionality and performance of the substrate can be more realistic tested before the final MCM assembly is manufactured and tested. The problems encountered by the prior art in using an untested substrate are therefore resolved.

Briefly, in a preferred embodiment, the present invention comprises a substrate having a top surface for mounting multiple integrated circuit (IC) chips. The substrate includes a first footprint comprising a plurality of electrical contacts disposed on the top surface for mounting a most performance-demanding IC chip thereon. The substrate further includes a set of substrate testing footprints comprising a plurality of package mounting and testing electrical contacts for temporarily mounting a plurality of testing packages to conduct a functional MCM test for the substrate mounted with the most performance-demanding IC chip and the testing packages. In a preferred embodiment, the substrate further includes a plurality of solder balls disposed on a bottom surface of the substrate opposite the top surface. In a preferred embodiment, the substrate further includes a plurality interconnecting traces interconnected between the electrical contacts of the first footprint and the set of substrate testing footprints. In a preferred embodiment, the first footprint for mounting the most performance-demanding IC chip includes a plurality of electrical contacts arranged for wire-bonding the most performance-demanding IC chip onto the substrate. In a preferred embodiment, the first footprint for mounting the most performance-demanding IC chip includes a plurality of electrical contacts arranged for disposing a packaged IC chip as the most performance-demanding IC chip onto the substrate. In a preferred embodiment, the set of substrate testing footprints comprising at least a set of chip-size package (CSP) electrical contacts for temporarily mounting at least a CSP testing package to conduct a functional MCM test for the substrate mounted with the most performance-demanding IC chip and the testing packages. In a preferred embodiment, the set of substrate testing footprints comprising at least a set of flip chip package (FCP) electrical contacts for temporarily mounting at least a flip-chip testing package to conduct a functional MCM test for the substrate mounted with the most performance-demanding IC chip and the testing packages. In a preferred embodiment, the set of substrate testing footprints comprising at least a set of signal generator electrical contacts for temporarily mounting at least a signal generator to conduct a functional MCM test for the substrate mounted with the most performance-demanding IC chip and the testing packages. In a preferred embodiment, the first footprint for mounting the most performance-demanding IC chip includes a plurality of electrical contacts arranged for mounting the most performance-demanding IC chip as a chip-size package onto the substrate. In a preferred embodiment, the first footprint for mounting the most performance-demanding IC chip includes a plurality of electrical contacts arranged for mounting the most performance-demanding IC chip as a flip-chip package onto the substrate.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figures 2A, 2B:
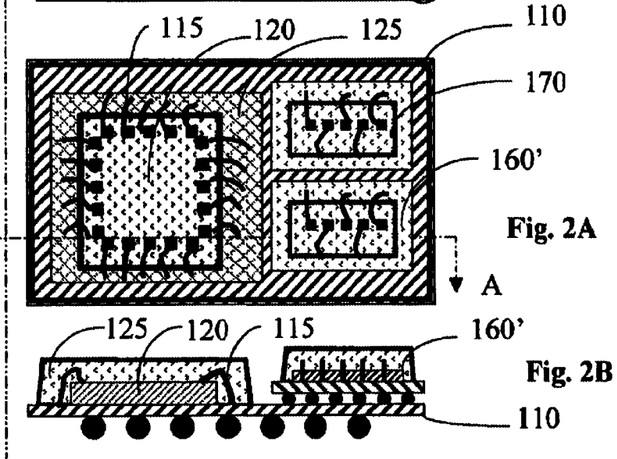
FIGS. 2A to 2C show a top view, a cross sectional view and a bottom view respectively of a MCM assembly manufactured with a new and improved method disclosed in this invention.
Figure 2C:
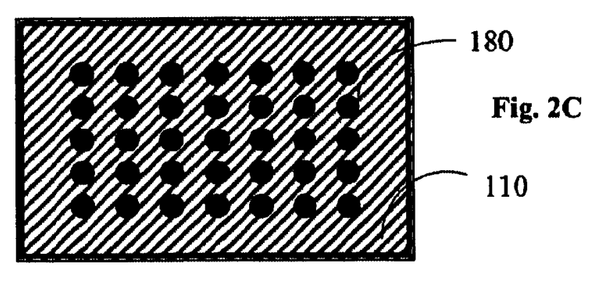
Figure 3:
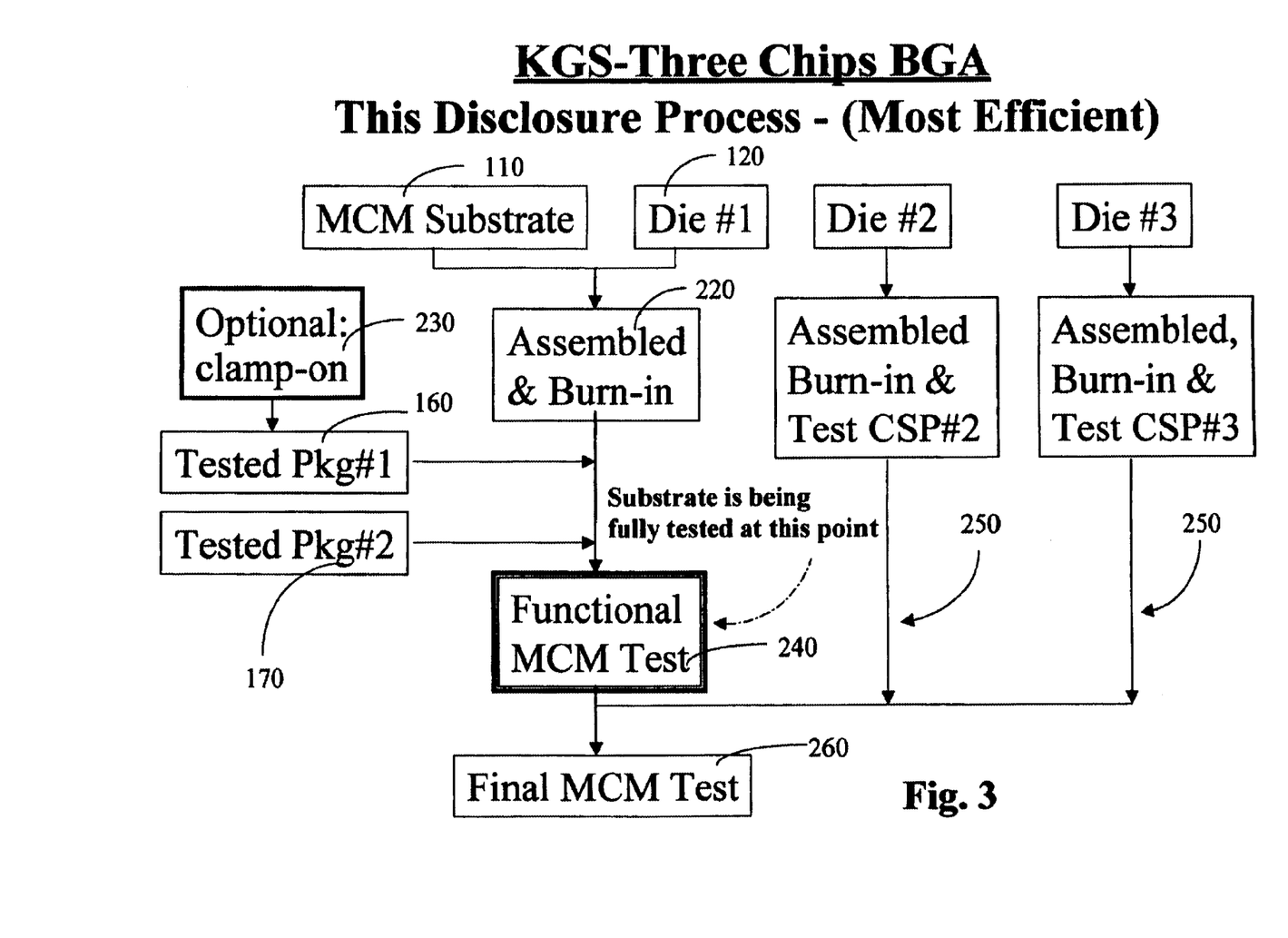
FIG. 3 is a flow chart for illustrating the new and improved process flow for manufacturing a MCM assembly of this invention.

Please refer to FIGS. 2A to 2C for a top view, cross sectional view and a bottom view respectively for a MCM assembly manufactured by a new and improved process of this invention as illustrated in FIG. 3. The process begins with a step of mounting a first integrated circuit (IC) chip 120, e.g., die #1, onto a substrate 110 that has a footprint shown in FIG. 4A for mounting the IC chip 120 with a chip-on-board (COB) applying a wire-bonding process. The top view of the substrate 110 as that shown in FIG. 4A also provides two chip-size package (CSP) footprints 130 and 140 for the purpose of testing and mounting known good CSP chips or flip chip on these footprints to be further discussed below.

Figure 4A:
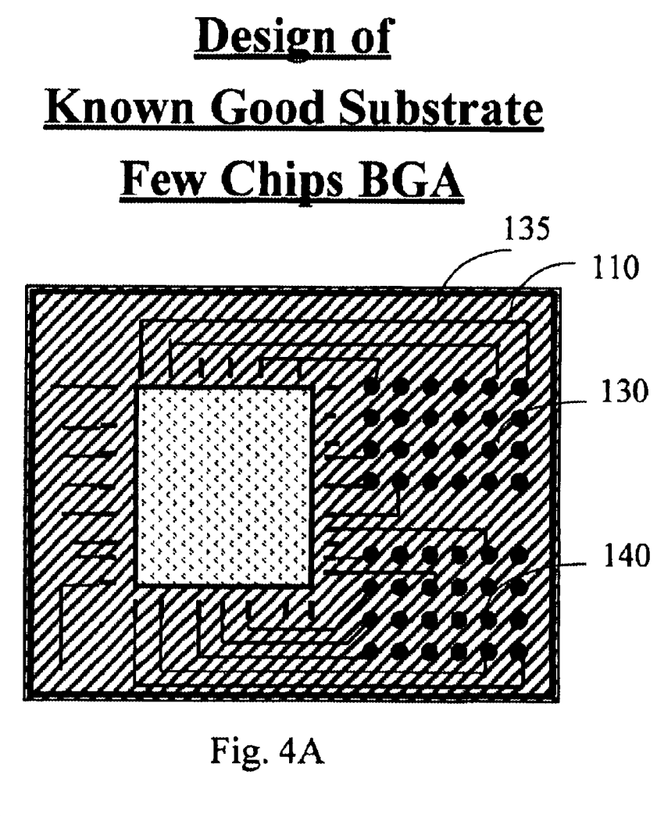
FIG. 4A is a top view of a substrate of this invention ready for mounting a most performance-demanding chip applying a regular COB process and two sets of CSP footprints for mounting two CSP packaged chip.
Figure 4B:
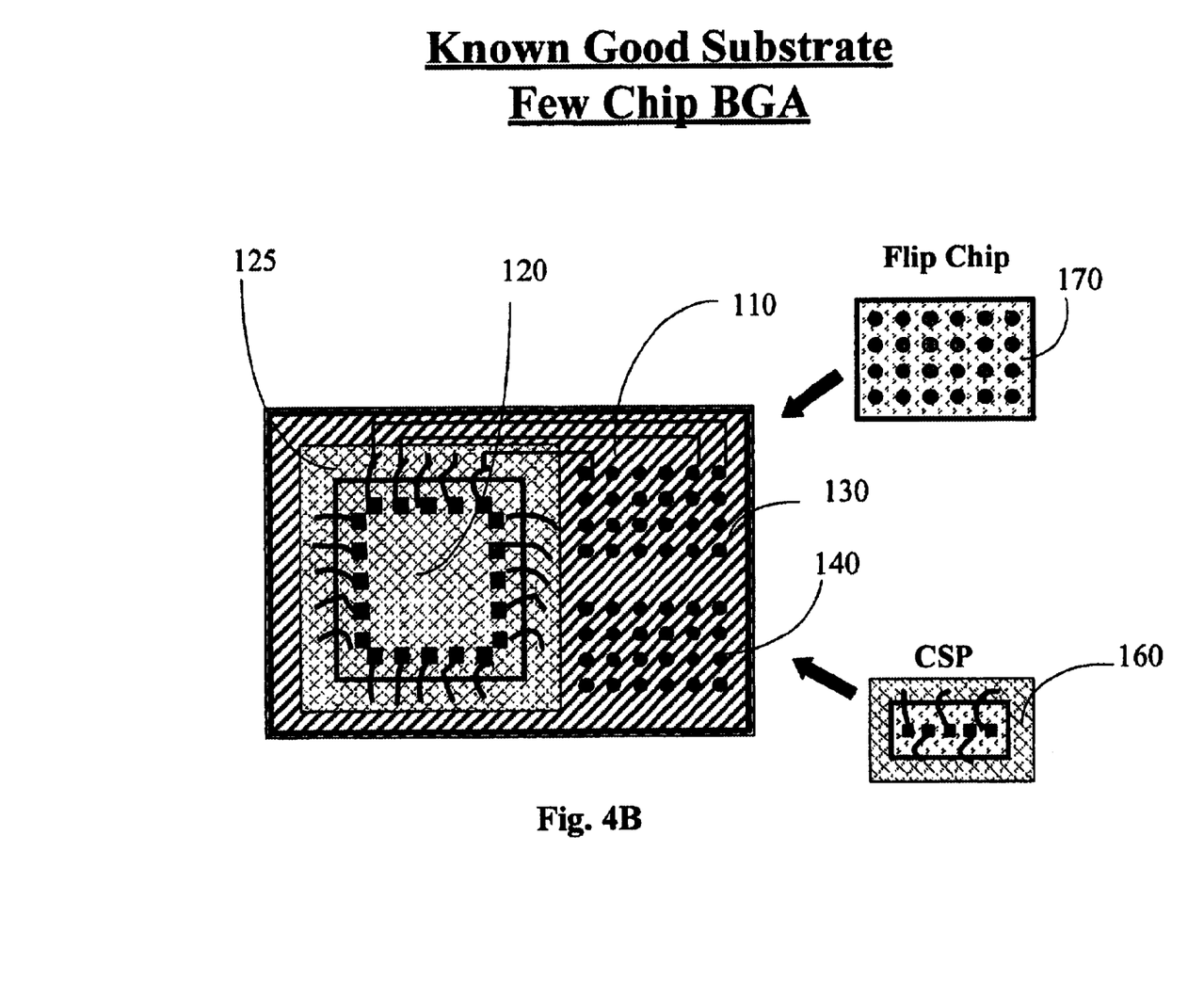
FIG. 4B is a top view of a substrate of this invention shown two testing packages such as a known good flip chip and a CSP chip for carrying out a MCM functional test with the substrate before final mounting of the remainder of the multiple chips.

According to the disclosure of this invention, a preferred embodiment is to mount a most performance-demanding chip 120 on the substrate 110. A top view of the substrate 110 is shown in FIG. 4A that is formed with a plurality of interconnecting traces 135 interconnected between electric contacts for the IC chip 120 and electric contacts of peripheral IC chips. A bottom view of the substrate 110 is shown in FIG. 2C. The substrate is provided with a plurality of solder balls 180 formed as a ball grid array (BGA). The most performance-demanding chip 120 typically is a processor chip that is mounted on the substrate 120 by applying a direct chip attachment (DCA) configuration and then wire bonded to the substrate 110 with bonding wires 115. The mounted and wire-bonded chip 120 is then encapsulated with an encapsulation layer 125. A burn-in test is performed on the encapsulated chip 120 now assembled to the substrate 110 (step 220) to assure that the substrate together with the encapsulated chip 120, e.g., the most performance-demanding chip, are qualified through the burn-in tests. Referring to FIG. 4B for a top view of the substrate 120 mounted with the first chip 120 and having two sets of CSP footprints 130 and 140.

According to the method of this invention, a substrate testing process is performed by clamping on two know good chips that can either be a flip chip or a CSP chip (step 230). These two test packages 160 and 170 can also be implemented with signal generators for performing a substrate testing. A full functional test (step 240) is then carried out to assure the most performance-demanding chip 120 mounted on the substrate 110 working together with the remainder of the multiple chips, e.g., chips 160 and 170, can satisfy the functional requirements. The test would assure that the requirements according the specifications of the total and final MCM assembly are now satisfied based on test of the assembly formed in a near-realistic configuration. After the functional MCM test is completed, the second and third chips, preferably known good dies (KGD), e.g., CSP #2 and CSP #3, are burned in and tested Step 250), and mounted onto the substrate 110 to complete the final MCM test (step 260).

According to above descriptions, a multiple chip module (MCM) supported on a substrate having a top surface for mounting multiple integrated circuit (IC) chips is disclosed in this invention. The MCM includes a first IC chip mounted on the top surface of the substrate. The MCM further includes a set of substrate testing footprints comprising a plurality of package mounting and testing electrical contacts for temporarily mounting a plurality of testing packages to conduct a functional MCM test for the substrate mounted with the first IC chip and the testing packages. In a preferred embodiment, the MCM further includes an encapsulation for encapsulating the first IC chip. In a preferred embodiment, the first IC chip is a most performance-demanding chip among the multiple IC chips. In a preferred embodiment, the MCM further includes a plurality of solder balls disposed on a bottom surface of the substrate opposite the top surface. In a preferred embodiment, the MCM further includes a plurality interconnecting traces interconnected between electrical contacts connected to the first IC chip and the electric contacts of the set of substrate testing footprints. In a preferred embodiment, the first IC chip encapsulated in the encapsulation is mounted onto the substrate with a wire-bonding configuration. In a preferred embodiment, the first IC chip is a chip-size package IC chip mounted onto the substrate. In a preferred embodiment, the first IC chip is a flip-chip package IC chip mounted onto the substrate. In a preferred embodiment, the set of substrate testing footprints comprising at least a set of chip-size package (CSP) electrical contacts for temporarily mounting at least a CSP testing package to conduct a functional MCM test for the substrate mounted with the first IC chip and the testing packages. In a preferred embodiment, the set of substrate testing footprints comprising at least a set of flip-chip package (CSP) electrical contacts for temporarily mounting at least a flip-chip testing package to conduct a functional MCM test for the substrate mounted with the first IC chip and the testing packages. In a preferred embodiment, the set of substrate testing footprints comprising at least a set of signal generator electrical contacts for temporarily mounting at least a signal generator to conduct a functional MCM test for the substrate mounted with the first IC chip and the testing packages. In a preferred embodiment, the substrate further includes a first footprint for mounting the first IC chip and the first footprint includes a plurality of electrical contacts arranged for mounting the first IC chip as a chip-size package onto the substrate. In a preferred embodiment, the MCM further includes a first footprint for mounting the first IC chip and the first footprint includes a plurality of electrical contacts arranged for mounting the first IC chip as a flip-chip package onto the substrate.

Figures 5A, 5B:
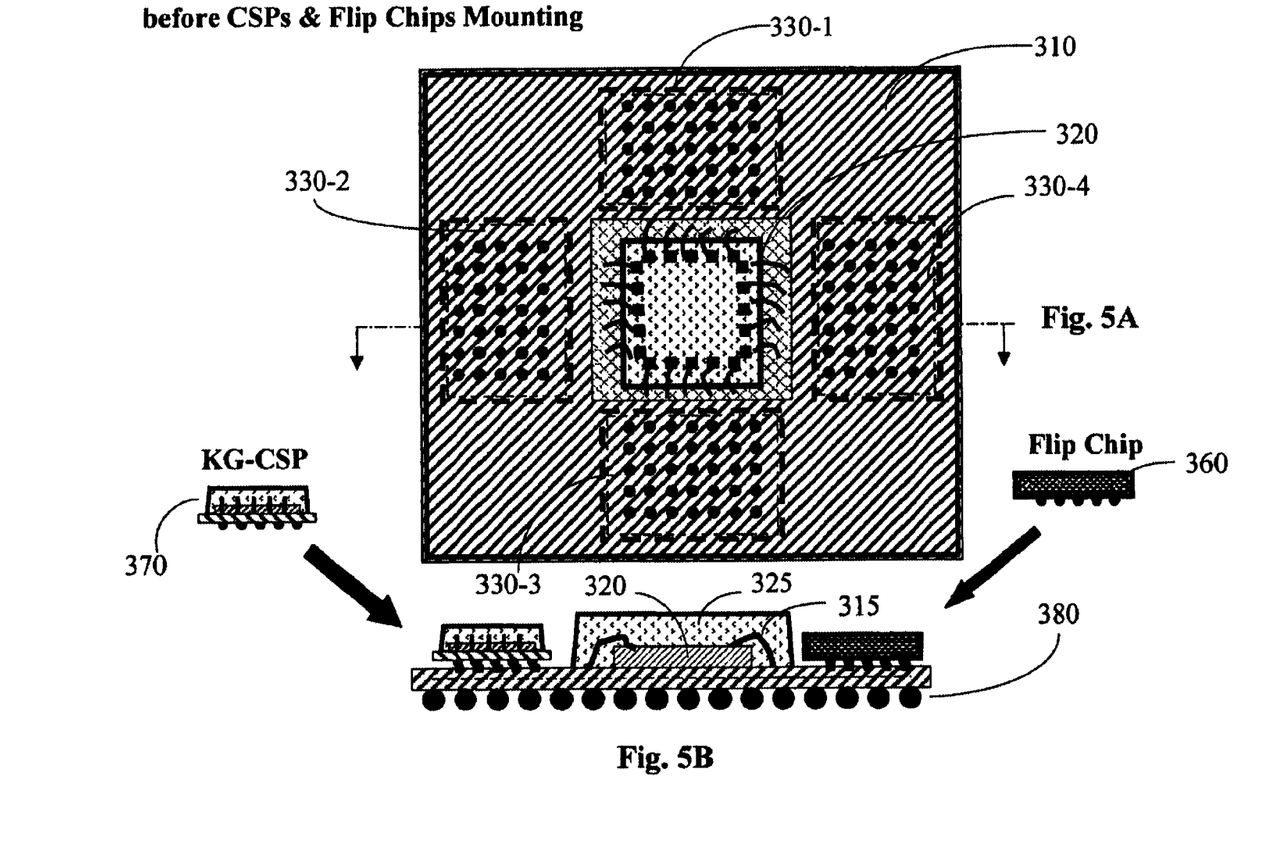
FIGS. 5A and 5B are a top view and a cross sectional view of another MCM assembly of this invention.

FIG. 5 shows another preferred embodiment with a most performance-demanding IC chip 320 disposed in the center of the top surface of a substrate 310. The most performance-demanding IC chip 320 is first wire-bonded to the substrate 310 with bonding wires 315 and encapsulated with an encapsulation 325. Four test packages are then mounted on a set of four footprints 330-1 to 330-4 to perform a MCM functional test (step 240) to assure the substrate can function properly to satisfy all the functional specification of the MCM performance requirements. Four known-good packaged IC chips include at least one flip chip 360 and one chip-size package IC chip are then mounted on the footprints to complete the final MCM test (step 260). The MCM assembly is further provided with solder balls 380 formed as BGA array on the bottom surface of the substrate 310 for further mounting and connecting to external circuit board.

This invention further discloses a method for mounting multiple integrated circuit (IC) chips on a top surface of a substrate. The method includes a step of forming a fist footprint to include a plurality of electrical contacts on the top surface for mounting a most performance-demanding IC chip thereon. The method further includes a step of forming a set of substrate testing footprints to include a plurality of package mounting and testing electrical contacts for temporarily mounting a plurality of testing packages to conduct a functional MCM test for the substrate. The substrate under test is mounted with the most performance-demanding IC chip and the testing packages. In a preferred embodiment, the method further includes a step of forming a plurality of solder balls on a bottom surface of the substrate opposite the top surface. In a preferred embodiment, the method further includes a step of forming a plurality interconnecting traces for interconnecting the electrical contacts of the first footprint and the set of substrate testing footprints. In a preferred embodiment, the method further includes a step of forming the first footprint for mounting the most performance-demanding IC chip includes a step of forming a plurality of electrical contacts arranged for wire-bonding the most performance-demanding IC chip onto the substrate. In a preferred embodiment, the step of forming the first footprint for mounting the most performance-demanding IC chip includes a step of forming a plurality of electrical contacts arranged for disposing a packaged IC chip as the most performance demanding IC chip onto the substrate. In a preferred embodiment, the step of forming the set of substrate testing footprints comprising a step of forming at least a set of chip-size package (CSP) electrical contacts for temporarily mounting at least a CSP testing package to conduct a functional MCM test for the substrate mounted with the most performance-demanding IC chip and the testing packages. In a preferred embodiment, the step of forming the set of substrate testing footprints comprising a step of forming at least a set of flip-chip package (CSP) electrical contacts for temporarily mounting at least a flip-chip testing package to conduct a functional MCM test for the substrate mounted with the most performance-demanding IC chip and the testing packages. In a preferred embodiment, the step of forming the set of substrate testing footprints comprising a step of forming at least a set of signal generator electrical contacts for temporarily mounting at least a signal generator to conduct a functional MCM test for the substrate mounted with the most performance-demanding IC chip and the testing packages. In a preferred embodiment, the step of forming the first footprint for mounting the most performance-demanding IC chip includes a step of forming a plurality of electrical contacts arranged for mounting the most performance-demanding IC chip as a chip-size package onto the substrate. In a preferred embodiment, the step of forming the first footprint for mounting the most performance-demanding IC chip includes a step of forming a plurality of electrical contacts arranged for mounting the most performance-demanding IC chip as a flip-chip package onto the substrate.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A substrate having a top surface for mounting multiple integrated circuit (IC) chips comprising:
   a most performance-demanding IC chip encapsulated under an encapsulation mounted on said substrate; and
   a set of chip-size-package(CSP)/flip-chip contact footprints disposed next to and interconnected via a plurality of connecting traces to said most performance demanding IC chip for carrying out a burn-in test for said substrate mounted with said most performance-demanding IC chip with said connecting traces connected to said CSP/flip-chip contact footprints.

2. The substrate of claim 1 wherein:

said set of CSP/flip-chip contact footprints further comprising a plurality of solder balls ready for mounting a CSP or a flip-chip thereon.

3. The substrate of claim 1 further comprising:

a known-good peripheral IC chip clamped on to said set of CSP/flip-chip contact footprints for carrying on full-functional multiple-chip test.

4. The substrate of claim 1 wherein:

said most performance-demanding IC chip is wire-bonded onto said substrate.

5. The substrate of claim 1 wherein:

said most performance-demanding IC chip is a chip-on-board (COB) chip by wire bonding said most performance-demanding IC chip directly onto said substrate.

6. The substrate of claim 1 wherein:

said set of CSP/flip-chip contact footprints further comprising a plurality of solder balls ready for mounting a CSP chip thereon to conduct a functional MCM test for said substrate mounted with said most performance-demanding IC chip and said CSP chip.

7. The substrate of claim 1 wherein:

said set of CSP/flip-chip contact footprints further comprising a plurality of solder balls ready for mounting a flip-chip thereon to conduct a functional MCM test for said substrate mounted with said most performance-demanding IC chip and said flip-chip.

8. The substrate of claim 3 further comprising:

at least a set of signal generator electrical contacts for temporarily mounting at least a signal generator to conduct a functional MCM test for said substrate mounted with said most performance-demanding IC chip and said known-good CSP or flip-chip.

9. The substrate of claim 1 wherein:

said most performance-demanding IC chip is packaged as a chip-size package (CSP) mounted onto said substrate.

10. The substrate of claim 1 wherein:

said most performance-demanding IC chip is a flip-chip mounted directly onto said substrate.

* * * * *